(12) United States Patent
Hsiao et al.

(10) Patent No.: US 11,644,427 B2
(45) Date of Patent: May 9, 2023

(54) AUTOMATIC DETECTION METHOD AND AUTOMATIC DETECTION SYSTEM FOR DETECTING CRACK ON WAFER EDGES

(71) Applicant: UNITED MICROELECTRONICS CORP., Hsinchu (TW)

(72) Inventors: Chia-Feng Hsiao, Tainan (TW); Chung-Hsuan Wu, Tainan (TW); Shuo-Yu Chen, Pingtung County (TW); Nai-Ying Lo, Kaohsiung (TW); Yi-Hui Tseng, Taoyuan (TW); Chen-Hui Huang, Hsinchu (TW); Yung-Yu Yang, Tainan (TW); Tzu-Ping Kao, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 120 days.

(21) Appl. No.: 17/100,982

(22) Filed: Nov. 23, 2020

(65) Prior Publication Data

US 2022/0128485 A1 Apr. 28, 2022

(30) Foreign Application Priority Data

Oct. 23, 2020 (CN) .......................... 202011144170.9

(51) Int. Cl.
*G06K 9/00* (2022.01)
*G01N 21/95* (2006.01)
(Continued)

(52) U.S. Cl.
CPC ..... *G01N 21/9503* (2013.01); *G01N 21/8851* (2013.01); *G01N 21/95607* (2013.01);
(Continued)

(58) Field of Classification Search
CPC .... G06K 9/00; G06K 9/00503; G06K 9/0051; G06K 9/0053; G06K 9/6255; G06V 10/20; G06V 10/22; G06V 10/26; G06V 10/267; G06V 10/28; G06V 10/30; G06V 10/34; G06V 10/98; G06V 10/993; G06T 5/00; G06T 5/001; G06T 5/002; G06T 5/50; G06T 7/0002; G06T 7/0004; G06T 7/0006; G06T 7/0008; G06T 7/001; G06T 7/10; G06T 7/11; G06T 7/12; G06T 7/13;
(Continued)

(56) References Cited

U.S. PATENT DOCUMENTS 5,859,698 A * 1/1999 Chau ................ G01N 21/95607
382/149
7,149,340 B2 12/2006 Filseth et al.
(Continued)

*Primary Examiner* — Eric Rush
(74) *Attorney, Agent, or Firm* — WPAT, P.C.

(57) ABSTRACT

An automatic detection method and an automatic detection system for detecting any crack on wafer edges are provided. The automatic detection method includes the following steps. Several wafer images of several wafers are obtained. The wafer images are integrated to create a templet image. Each of the wafer images is compared with the templet image to obtain a differential image. Each of the differential images is binarized. Each of the differential images which are binarized is de-noised. Whether each of the differential images has an edge crack is detected according to pattern of each of the differential images which are de-noised.

19 Claims, 11 Drawing Sheets

(51) Int. Cl.
*H01L 21/66* (2006.01)
*G01N 21/956* (2006.01)
*G06T 7/00* (2017.01)
*G06T 7/13* (2017.01)
*G06V 10/30* (2022.01)
*G06V 10/28* (2022.01)
*G06V 10/26* (2022.01)
*G01N 21/88* (2006.01)
*G06T 5/50* (2006.01)
*G06V 10/22* (2022.01)

(52) U.S. Cl.
CPC .............. *G06T 5/50* (2013.01); *G06T 7/001* (2013.01); *G06T 7/0004* (2013.01); *G06T 7/13* (2017.01); *G06V 10/22* (2022.01); *G06V 10/26* (2022.01); *G06V 10/28* (2022.01); *G06V 10/30* (2022.01); *H01L 22/24* (2013.01); *G06T 2207/20212* (2013.01); *G06T 2207/20221* (2013.01); *G06T 2207/30148* (2013.01)

(58) Field of Classification Search
CPC .......... G06T 7/136; G06T 7/174; G06T 7/60; G06T 7/97; G06T 2207/20212; G06T 2207/20221; G06T 2207/20224; G06T 2207/30108; G06T 2207/30148; G06T 7/155; G06T 2207/10004; G06T 2207/20132; G01N 21/88; G01N 21/8803; G01N 21/8851; G01N 21/95; G01N 21/9501; G01N 21/9503; G01N 21/9505; G01N 21/956; G01N 21/95607; G01N 2021/8861; G01N 2021/8877; G01N 2021/888; G01N 2021/8887; G01N 2021/95615; H01L 21/00; H01L 21/02; H01L 21/02002; H01L 21/02005; H01L 22/12; H01L 22/24; H01L 22/20

USPC ....... 382/100, 141, 144–147, 149, 151, 152, 382/169, 171, 173, 199, 203, 209, 382/217–219, 237, 251, 254, 256, 257, 382/260, 266, 273, 276, 282, 283, 293; 438/4–7, 14–16; 702/33–36, 81–85, 167, 702/179; 716/112; 348/86, 87, 92, 125, 348/126, 128–130; 356/2, 237.1, 237.2, 356/237.3, 237.4, 237.5, 394

See application file for complete search history.

(56) References Cited

U.S. PATENT DOCUMENTS

| | | | | |
|---|---|---|---|---|
| 7,616,804 | B2 * | 11/2009 | Pai | G01N 21/9501 |
| | | | | 382/199 |
| 7,676,077 | B2 * | 3/2010 | Kulkarni | H01L 21/67005 |
| | | | | 382/145 |
| 7,733,473 | B2 | 6/2010 | Yamashita et al. | |
| 7,796,804 | B2 * | 9/2010 | Bhaskar | G06T 7/001 |
| | | | | 382/103 |
| 10,782,242 | B2 * | 9/2020 | Muhr | G06T 7/001 |
| 2003/0202178 | A1 * | 10/2003 | Tsuji | G01N 21/9503 |
| | | | | 356/237.2 |
| 2011/0280470 | A1 * | 11/2011 | Hayashi | G06T 7/0004 |
| | | | | 382/149 |
| 2012/0114220 | A1 * | 5/2012 | Srocka | G06T 7/001 |
| | | | | 382/144 |
| 2012/0268585 | A1 * | 10/2012 | Markwort | H01L 21/681 |
| | | | | 348/87 |
| 2013/0039471 | A1 * | 2/2013 | Wormington | G01N 23/20 |
| | | | | 378/81 |
| 2015/0036915 | A1 * | 2/2015 | Siahkali | G06T 7/001 |
| | | | | 382/149 |

* cited by examiner

AUTOMATIC DETECTION METHOD AND AUTOMATIC DETECTION SYSTEM FOR DETECTING CRACK ON WAFER EDGES

This application claims the benefit of People's Republic of China application Serial No. 202011144170.9, filed Oct. 23, 2020, the subject matter of which is incorporated herein by reference.

BACKGROUND OF THE INVENTION

Field of the Invention

The invention relates in general to an automatic detection method and an automatic detection system, and more particularly to an automatic detection method and an automatic detection system for detecting any edge crack on wafer edges.

Description of the Related Art

Along with the advance and development in the electronics technology, the demand for wafers is ever increasing. In a semiconductor factory, wafers are processed with thousands of manufacturing processes to manufacture various electronic elements. During the manufacturing process, wafers are frequently moved between robots and machines.

The research personnel have found that a wafer may have an edge crack, and the wafer with the edge crack may easily break in subsequent processes. When the above scenario occurs, a considerable amount of production resources will be wasted.

Therefore, the research personnel are devoted to developing a detection method to quick detect the edge crack and avoid the waste of production resources.

SUMMARY OF THE INVENTION

The invention is directed to an automatic detection method and an automatic detection system for detecting any crack on wafer edges, in which a templet image is created using an image processing technique to quickly detect the edge crack and avoid the waste of production resources.

According to a first aspect of the present invention, an automatic detection method for detecting any crack on wafer edges is disclosed. The automatic detection method includes the following steps. Several wafer images of several wafers are obtained. The wafer images are integrated to create a templet image. Each of the wafer images is compared with the templet image to obtain a differential image. Each of the differential images is binarized. Each of the differential images which are binarized is de-noised. Whether each of the differential images has an edge crack is detected according to pattern of each of the differential images which are de-noised.

According to a second aspect of the present invention, an automatic detection device for detecting any crack on wafer edges is disclosed. The automatic detection device includes an input unit, an integration unit, a comparison unit, a binarization unit, a de-noising unit and a detection unit. The input unit is configured to obtain several wafer images of several wafers. The integration unit is configured to integrate the wafer images to create a templet image. The comparison unit is configured to compare each of the wafer images with the templet image to obtain a differential image. The binarization unit is configured to binarize each of the differential images. The de-noising unit is configured to de-noise each of the differential images which are binarized. The detection unit is configured to detect whether each of the differential images has an edge crack according to pattern of each of the differential images which are de-noised.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
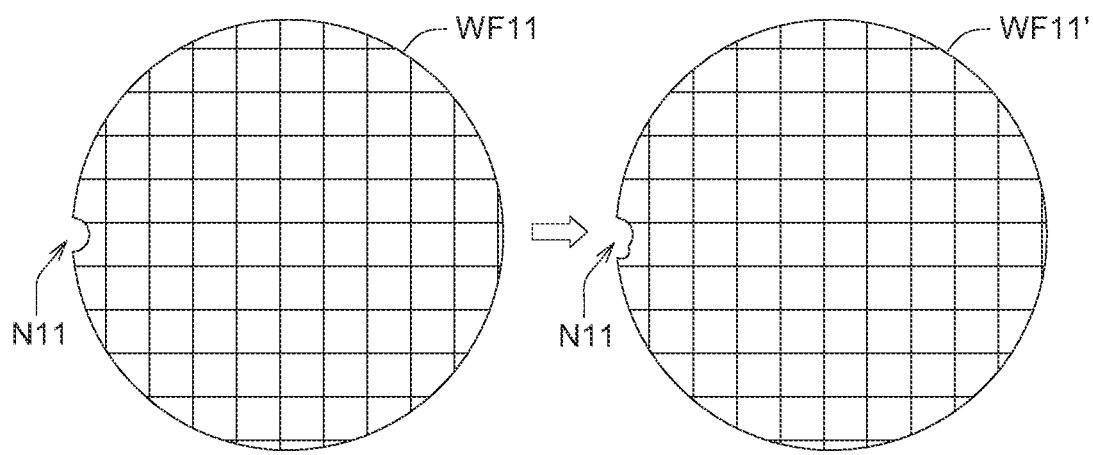
FIG. 1 is a schematic diagram illustrating a scenario of a wafer having an edge crack.
Figure 2:
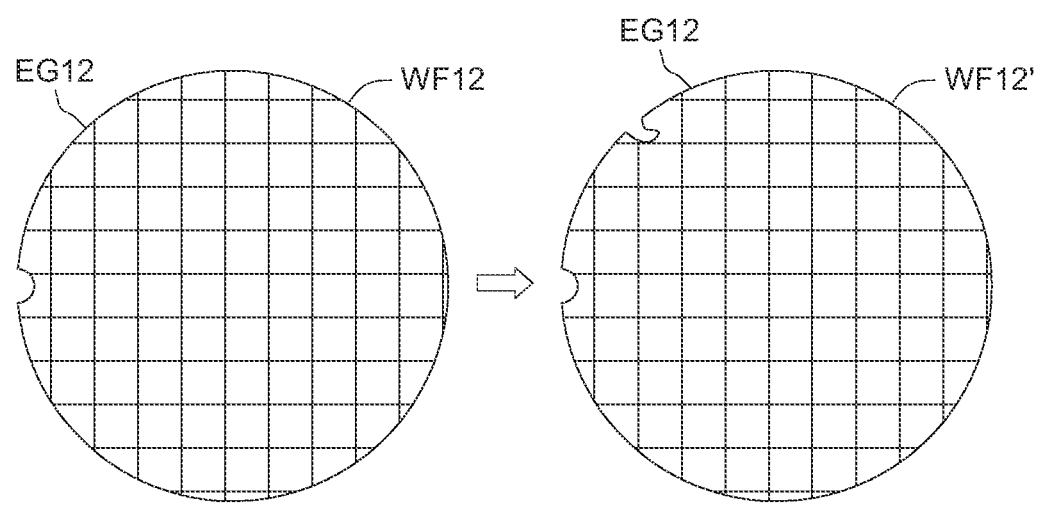
FIG. 2 is a schematic diagram illustrating another scenario of a wafer having an edge crack.

Referring to FIG. 1, a scenario of a wafer having an edge crack is illustrated. It can be seen from the wafer image WF11 of the wafer that the positioning notch N11 does not have any edge crack. After some manufacturing processes, it can be seen from the wafer image WF11' that the positioning notch N11 has the edge crack. Referring to FIG. 2, another scenario of a wafer having an edge crack is illustrated. It can be seen from the wafer image WF12 that the edge EG12 does not have any edge crack. After some manufacturing processes, it can be seen from the wafer image WF12' that the edge EG12 has the edge crack.

Figure 3:
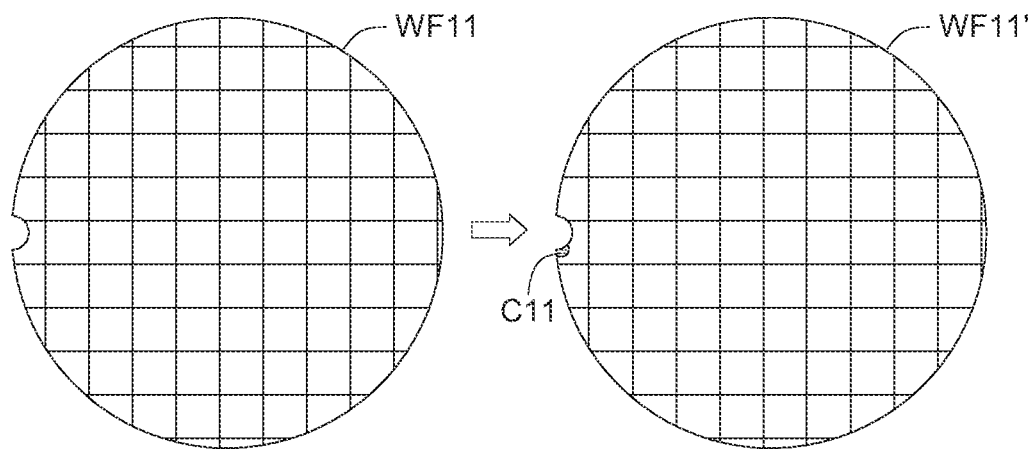
FIGS. 3 to 5 are schematic diagrams of marking an edge crack on a wafer image using an automatic detection method of the present embodiment.
Figure 4:
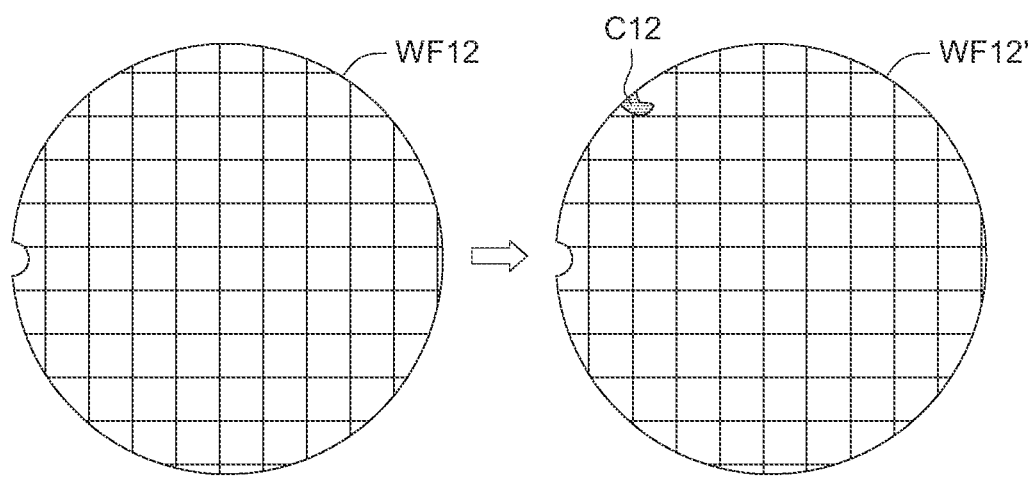
Figure 5:
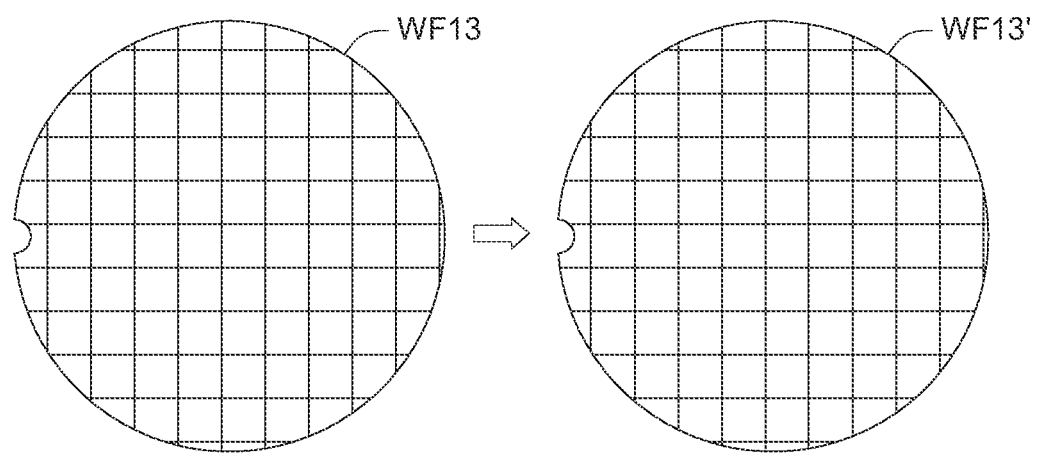

During the manufacturing process, whether the wafer meets the standards or has any defects is detected through image analysis. In the present embodiment, the research personnel further provide an automatic detection method for detecting any crack on wafer edges, in which the system is allowed to automatically analyze the images to determine whether the wafer has any edge crack as well as the position and shape of the edge crack if any. Referring to FIGS. 3 to 5, schematic diagrams of marking an edge crack on a wafer image using an automatic detection method of the present embodiment are illustrated. As indicated in FIG. 3, an edge crack C11 can be marked on the wafer image WF11' through the automatic detection method of the present embodiment. As indicated in FIG. 4, an edge crack C12 can be marked on the wafer image WF12' through the automatic detection method of the present embodiment. As indicated in FIG. 5, no edge crack is generated on the wafer image WF13, and after some manufacturing processes, no edge crack is generated on the wafer image WF13' either. Through the automatic detection method of the present embodiment, no edge crack will be erroneously marked on the wafer image WF13' not having any edge crack.

Figure 6:
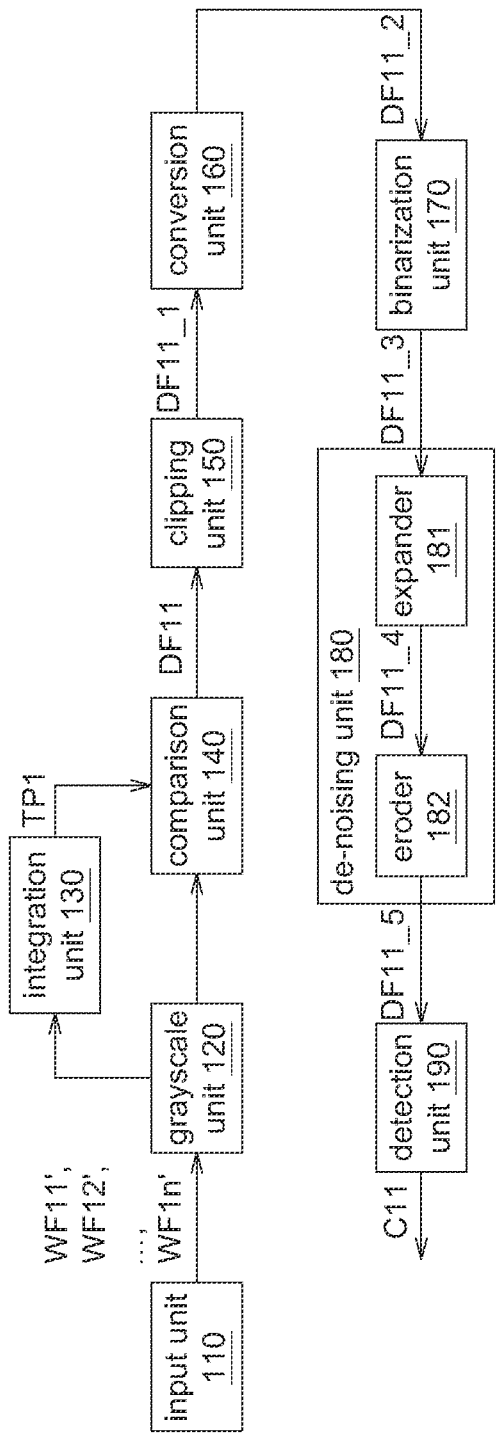
FIG. 6 is a block diagram of an automatic detection system according to an embodiment.

Referring to FIG. 6, a block diagram of an automatic detection system 100 according to an embodiment is illustrated. The automatic detection system 100 includes an input unit 110, a grayscale unit 120, an integration unit 130, a comparison unit 140, a clipping unit 150, a conversion unit 160, a binarization unit 170, a de-noising unit 180 and a detection unit 190. Overview function of each of the above elements is disclosed below. The input unit 110 is used to input data. The input unit 110 can be realized by a network transmission module, a hard disk, or a transmission line. The grayscale unit 120 is used to convert the color contents into monochromatic gray contents. The integration unit 130 is used to integrate the images. The comparison unit 140 is used to compare the images. The clipping unit 150 is used to clip the images. The conversion unit 160 is used to perform coordinate conversion. The binarization unit 170 is used to binarize the images. The de-noising unit 180 is used to de-noise the images. The detection unit 190 is used to detect the edge crack. The grayscale unit 120, the integration unit 130, the comparison unit 140, the clipping unit 150, the conversion unit 160, the binarization unit 170, the de-noising unit 180 and the detection unit 190 can be realized by a circuit, a chip, a circuit board, or s storage device storing programming codes. The operation of those elements is disclosed below with an accompanying flowchart.

Figure 7:
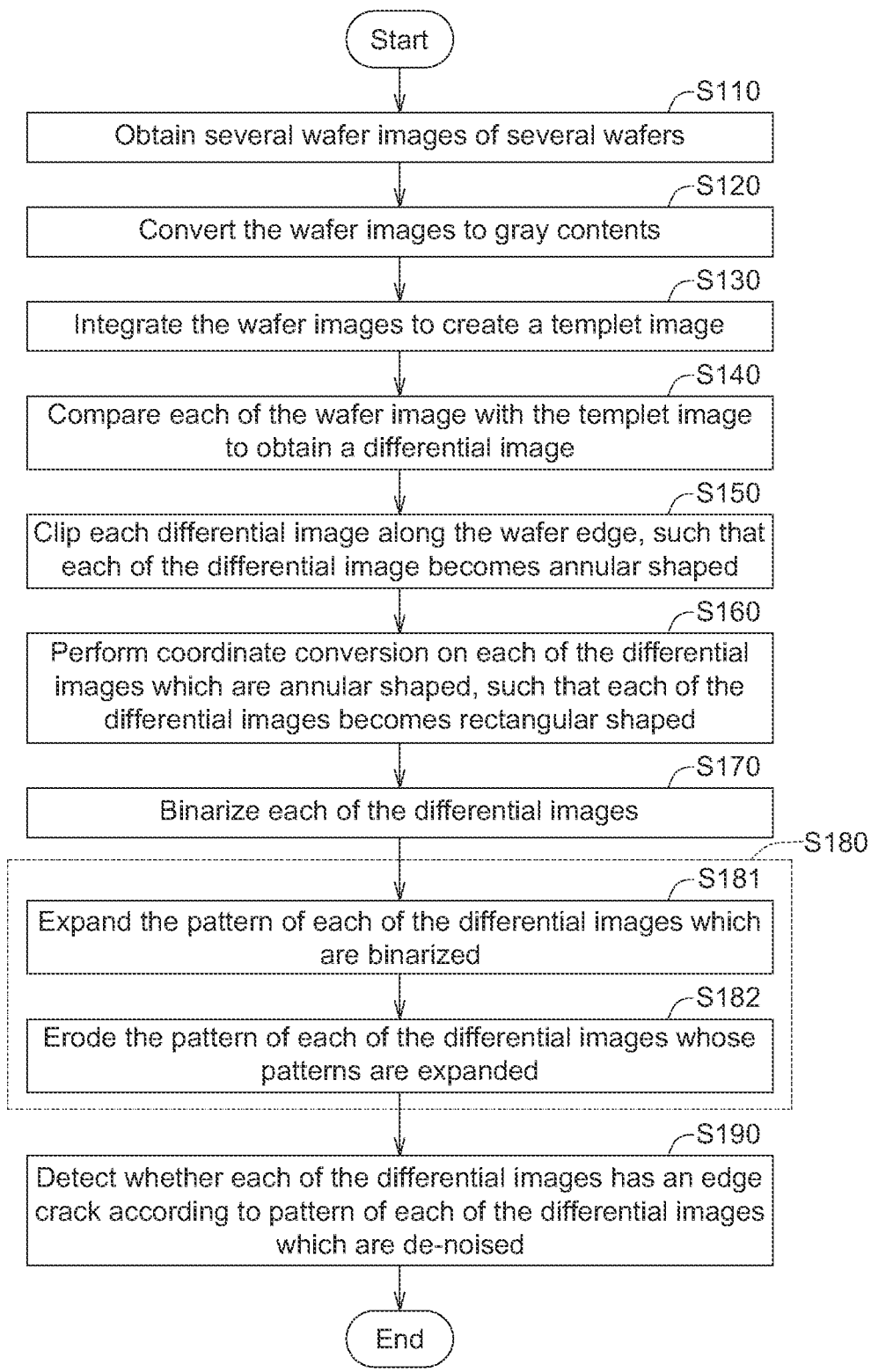
FIG. 7 is a flowchart of an automatic detection method according to an embodiment.

Referring to FIG. 7, a flowchart of an automatic detection method according to an embodiment is illustrated. The detection method of the present embodiment is performed before the manufacturing process of the wafer is completed, such that the edge crack can be immediately detected in the manufacturing process to avoid the waste of production resources. In step S110, several wafer images WF11', WF12', ..., WF1n' of several wafers are obtained by the input unit 110. In an embodiment, the wafer images WF11', WF12', ..., WF1n' belong to the same lot and are processed with the same manufacturing processes. Theoretically, the wafer images WF11', WF12', ..., WF1n' are similar to each other, and significant differences will occur only when an edge crack is generated.

Next, the method proceeds to step S120, the wafer images WF11', WF12', ..., WF1n' are converted to monochromatic gray contents by the grayscale unit 120. The present step is performed only when the wafer images WF11', WF12', ..., WF1n' are chromatic images. That is, the present step can be omitted if the wafer images WF11', WF12', ..., WF1n' are originally monochromatic.

Figure 8:
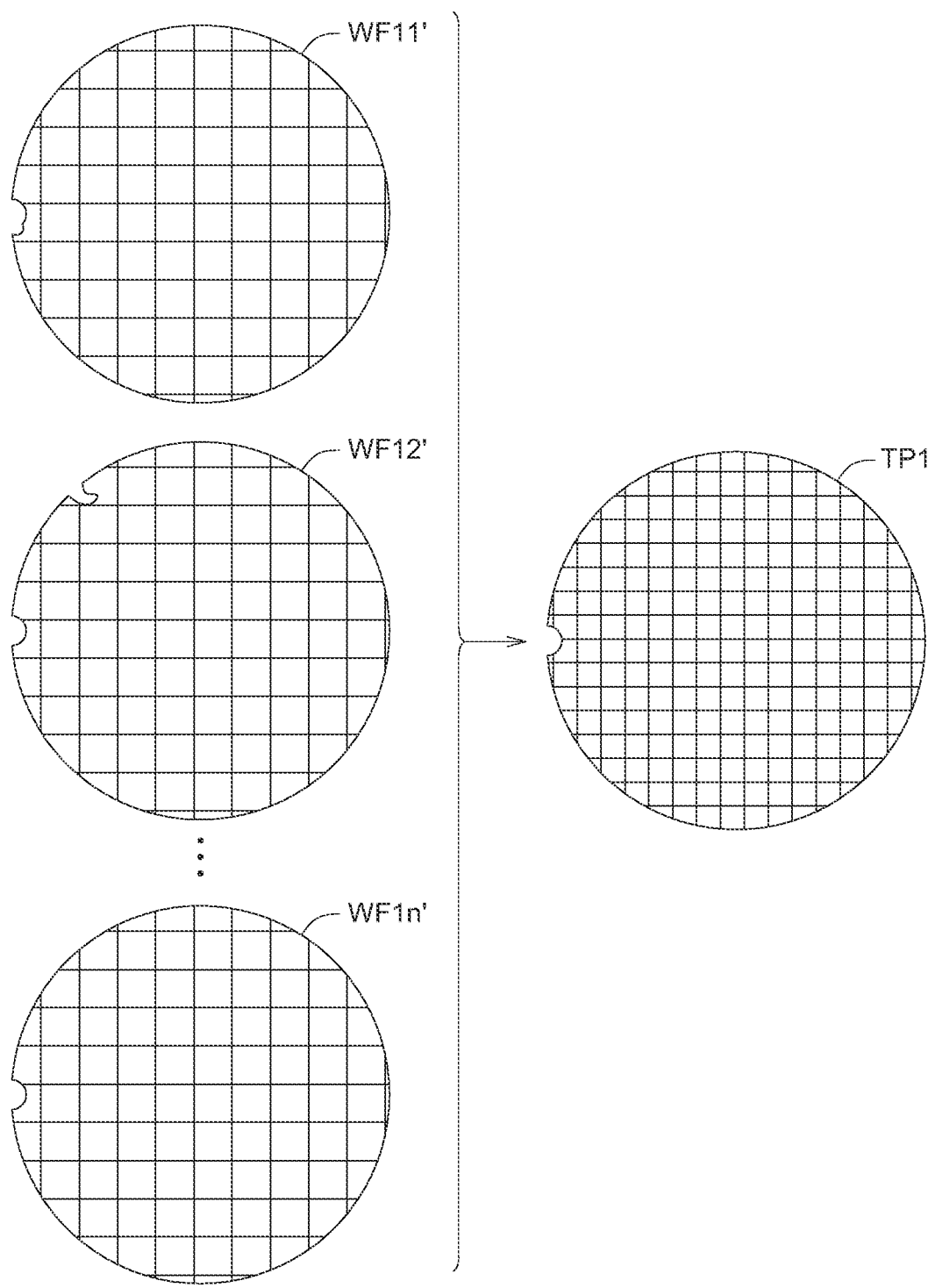
FIG. 8 is a schematic diagram of the step S130 according to an embodiment.

Then, the method proceeds to step S130, the wafer images WF11', WF12', ..., WF1n' are integrated by the integration unit 130 to create a templet image TP1. Referring to FIG. 8, a schematic diagram of the step S130 according to an embodiment is illustrated. Each of the wafer images WF11', WF12', ..., WF1n' has several pixels. The pixels containing the image of the wafer have larger pixel values, the pixels not containing the image of the wafer have smaller pixel values. In the present step, for each of the pixels, the maximum pixel value among the wafer images WF11', WF12', ..., WF1n' is obtained by the integration unit 130 to create the templet image TP1. Any pixels containing the image of the wafer in any of the wafer images WF11', WF12', ..., WF1n' will be shown in the templet image TP1. Therefore, no matter the wafer images WF11', WF12', ..., WF1n' have edge cracks or not, the templet image TP1 will show a complete wafer contour for the wafers of the same lot.

After that, the method proceeds to step S140, each of the wafer images WF11', WF12', ..., WF1n' is compared with the templet image TP1 by the comparison unit 140 to obtain a differential image. For example, at each pixel, the comparison unit 140 deducts the pixel value of the wafer image WF11' from the pixel value of the templet image TP1 to obtain a differential image DF11. The brighter part in the differential image DF11 has a greater difference between the wafer image WF11' and the templet image TP1. It is highly likely that the difference between the wafer image WF11' and the templet image TP1 is caused by the edge crack. Therefore, whether any edge crack exists can be determined according to the differential image DF11.

Figure 9:
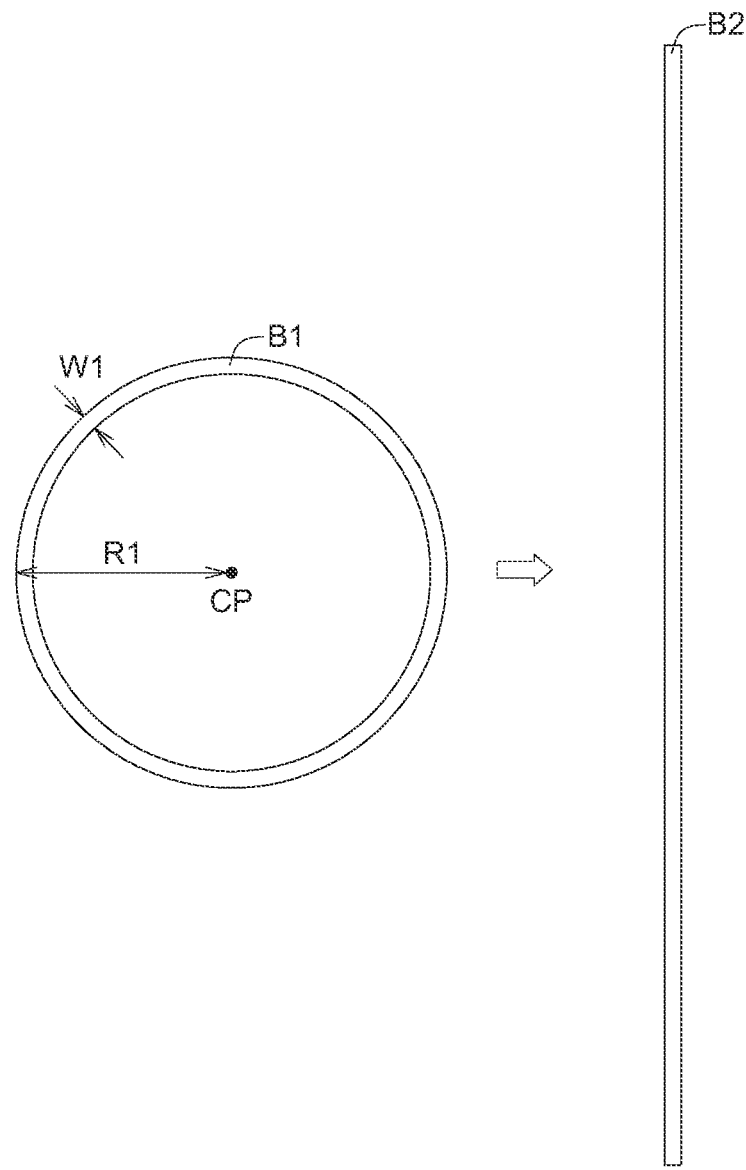
FIG. 9 is a schematic diagram of the steps S150 to S160.

Then, the method proceeds to step S150, each of the differential images (such as differential image DF11) is clipped along the wafer edge by the clipping unit 150, such that each of the differential images (such as differential image DF11) becomes annular shaped. Referring to FIG. 9, a schematic diagram of steps S150 to S160 is illustrated. The wafer has a circle center CP and a radius R1. The width W1 clipped by the clipping unit 150 substantially is 0.5%, 1%, 1.5% or 2% of the radius R1 of the wafer. Let the differential image DF11 be taken for example. After the differential image is clipped to an annular image, only the information at the edge is kept, such that the processing burden will be reduced in subsequent process to increase the processing speed.

After that, the method proceeds to step S160, each of the annular differential images (such as differential image DF11) is performed coordinate conversion by the conversion unit 160, such that each of the differential images (such as differential image DF11) becomes rectangular shaped. As indicated in FIG. 9, the annular image B1 is converted to a Cartesian coordinate system from a polar coordinate system to produce an image B2 with a rectangular shape.

Figure 10:
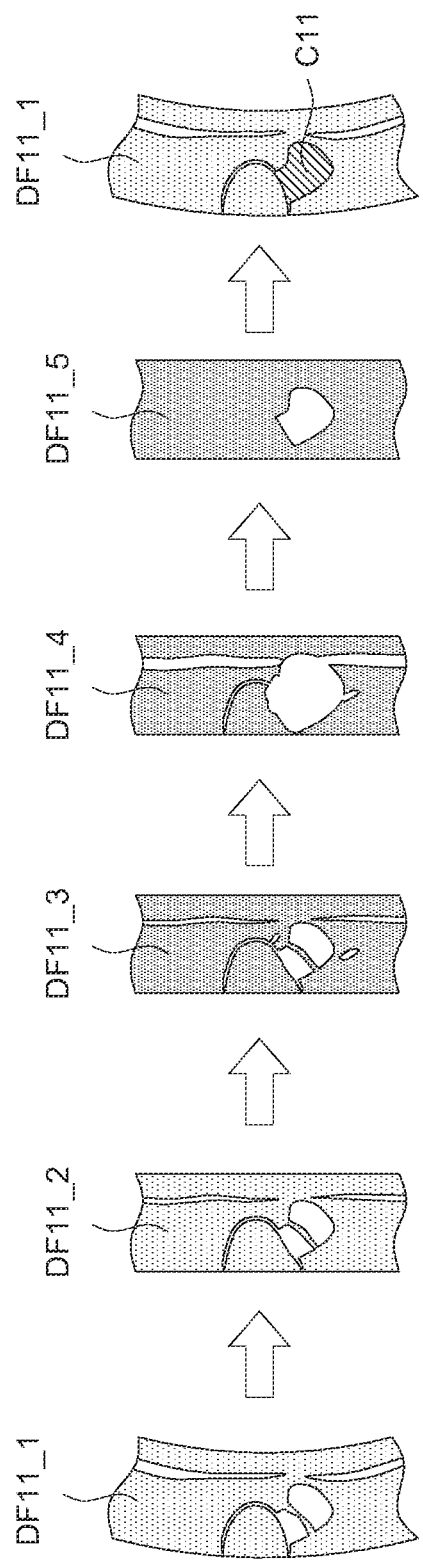
FIG. 10 is a schematic diagram of the steps S160 to S190.

Referring to FIG. 10, a schematic diagram of steps S160 to S190 is illustrated. Through step S160, the differential image DF11_1 which is annular shaped is converted to a differential image DF11_2 which is rectangular shaped. To analyze the differential image DF11_1, a larger scan range is required; to analyze the differential image DF11_2, a smaller scan range is required. Therefore, the conversion process performed in step S160 can further reduce the processing burden to increase the processing speed.

Then, the method proceeds to step S170, each of the differential images (such as differential image DF11_2) is binarized by the binarization unit 170. For example, the binarization unit 170 adjusts each of the pixels, whose pixel value is higher than a threshold value, to the maximum pixel value (such as 255), and adjusts each of the pixels, whose pixel value is lower than or equivalent to the threshold value, to the minimum pixel value (such as 0). As indicated in FIG. 10, on the differential image DF11_3, which is binarized, each of the pixels whose pixel value is 255 is pure white, and each of the pixels whose pixel value is 0 is pure black. The position of possible edge crack on the differential image DF11_3, which is binarized, can be more clearly identified.

After that, the method proceeds to step S180, each of the differential images, which are binarized (such as differential image DF11_3) is de-noised by the de-noising unit 180. As indicated in FIG. 10, the differential image DF11_3, which is binarized, still may contain many noises which need to removed using some image processing techniques. Step S180 includes steps S181 and S182. In step S181, the pattern of each of the differential images, which are binarized (such as differential image DF11_3) is expanded by the expander 181 of the de-noising unit 180. The pattern expansion process is to change adjacent pixels of white pixels to white color. For example, all pixels within 7 pixels of each of the white pixels are adjacent pixels. As indicated in FIG. 10, in the differential image DF11_4 whose pattern is expanded, the white blocks, which are originally fragmented can be combined as more a complete white block through the present step.

Then, the method proceeds to step S182, the pattern of each of the differential images, whose pattern are expanded (such as differential image DF11_4) is eroded by the eroder 182 of the de-noising unit 180. The pattern erosion process is to change adjacent pixels of black pixels to black color. For example, all pixels with 7 pixels of each of the black pixels are adjacent primitive points. As indicated in FIG. 10, in the differential image DF11_5 whose pattern is eroded, the white patterns, which are originally mixed can be removed through the present step to produce a more complete white block.

Pattern expansion and pattern erosion are respectively performed in step S181 and step S182. Since the degree of expansion is identical to the degree of erosion, the contour of the notch maintains at its original position, and minute noises are smoothly removed.

Then, the method proceeds to step S190, whether each of the differential images (such as differential image DF11_5) has an edge crack is detected by the detection unit 190 according to the pattern of each of the differential images, which are de-noised (such as differential image DF11_5). For example, the white block in the differential image DF11_5 detected by the detection unit 190 is the edge crack C11. The detection unit 190 can give a significant mark, such as a red mark, on the differential image DF11_1. Thus, before the semiconductor manufacturing process is completed, the edge crack can be quickly detected to avoid the waste of production resources.

Figure 11:
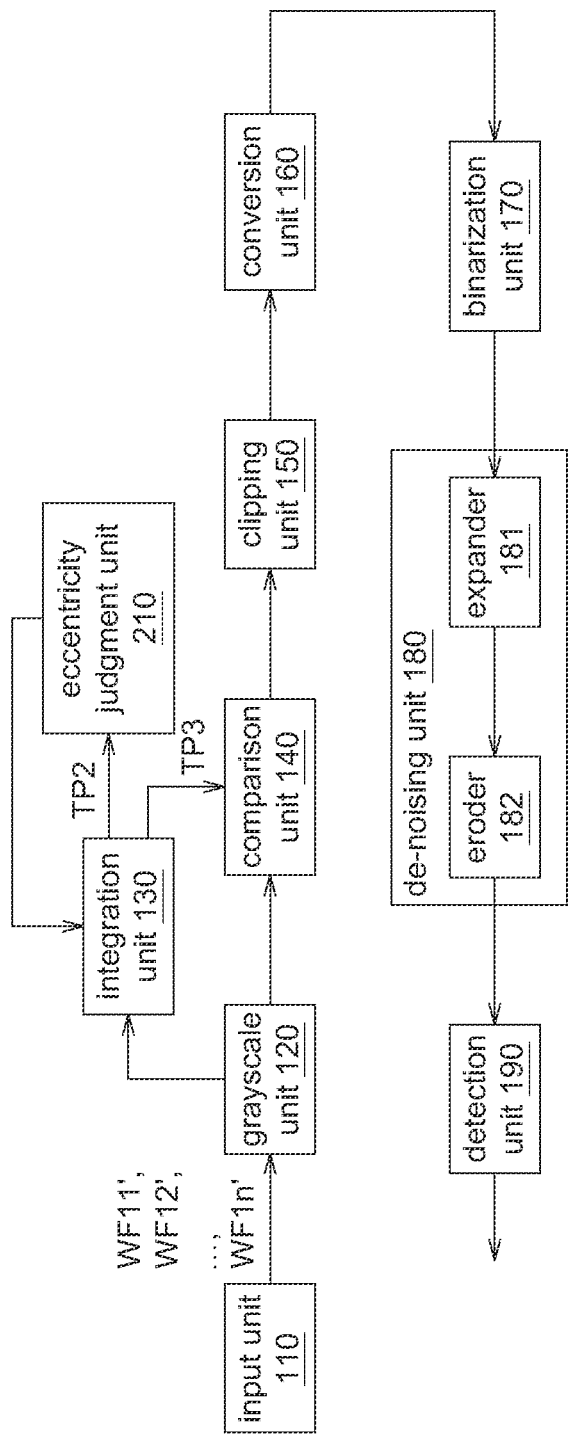
FIG. 11 is a block diagram of an automatic detection system according to another embodiment.
Figure 12:
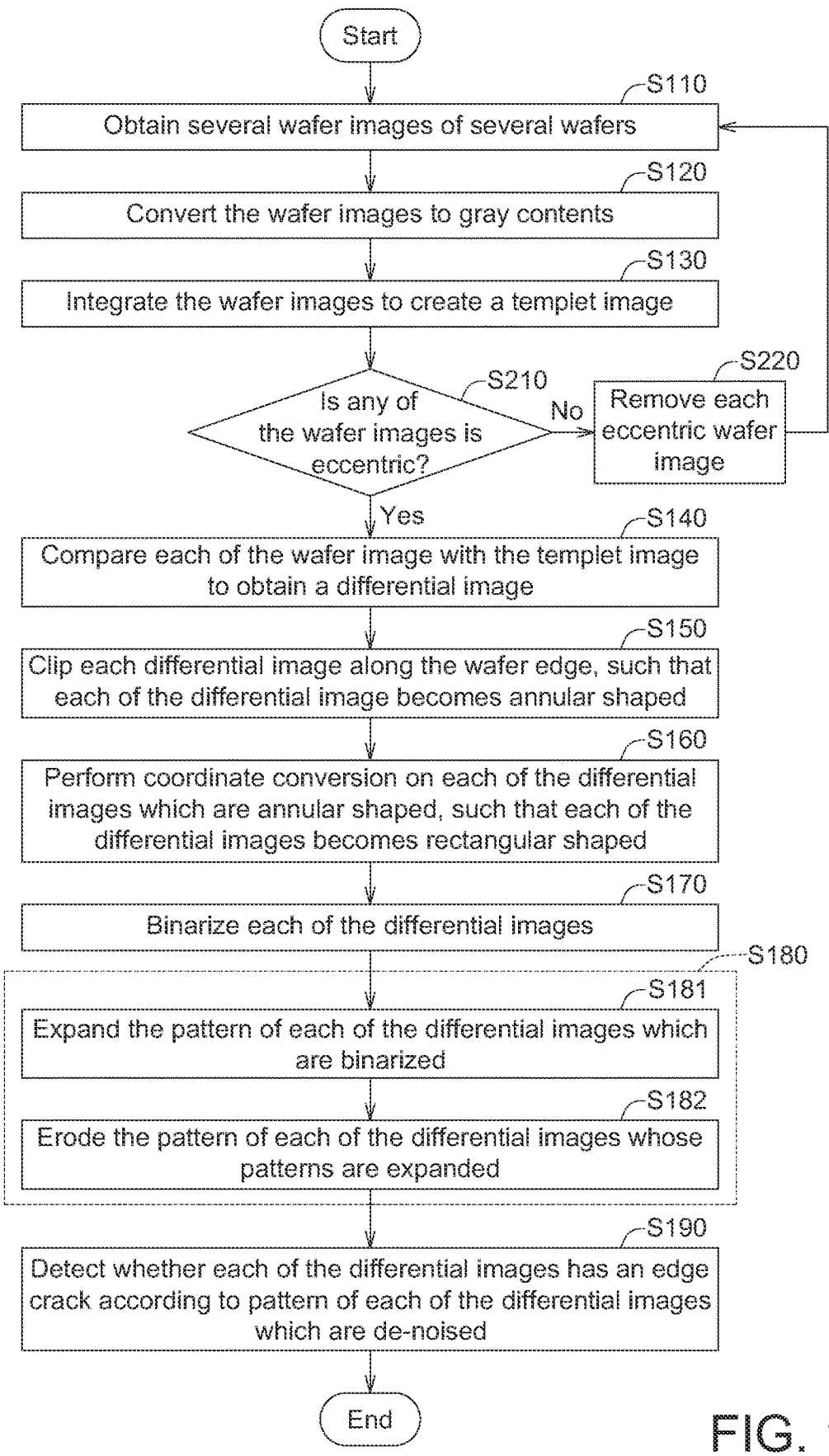
FIG. 12 is a flowchart of an automatic detection method according to another embodiment.

The research personnel further found that when capturing the wafer images WF11', WF12', . . . , WF1*n*', some wafer images may be eccentric and may affect the accuracy of the templet image. Refer to FIG. 11 and FIG. 12. FIG. 11 is a block diagram of an automatic detection system 200 according to another embodiment. FIG. 12 is a flowchart of an automatic detection method according to another embodiment. The automatic detection system 200 further includes an eccentricity judgment unit 210. After the templet image TP2 is obtained in step S130, the method proceeds to step S210. In step S210, whether any of the wafer images WF11', WF12', . . . , WF1*n*' is eccentric is determined by the eccentricity judgment unit 210. If none of the wafer images WF11', WF12', . . . , WF1*n*' is eccentric, the method proceeds to step S140; if any of the wafer images WF11', WF12', . . . , WF1*n*' is eccentric, the method proceeds to step S220.

Figure 13:
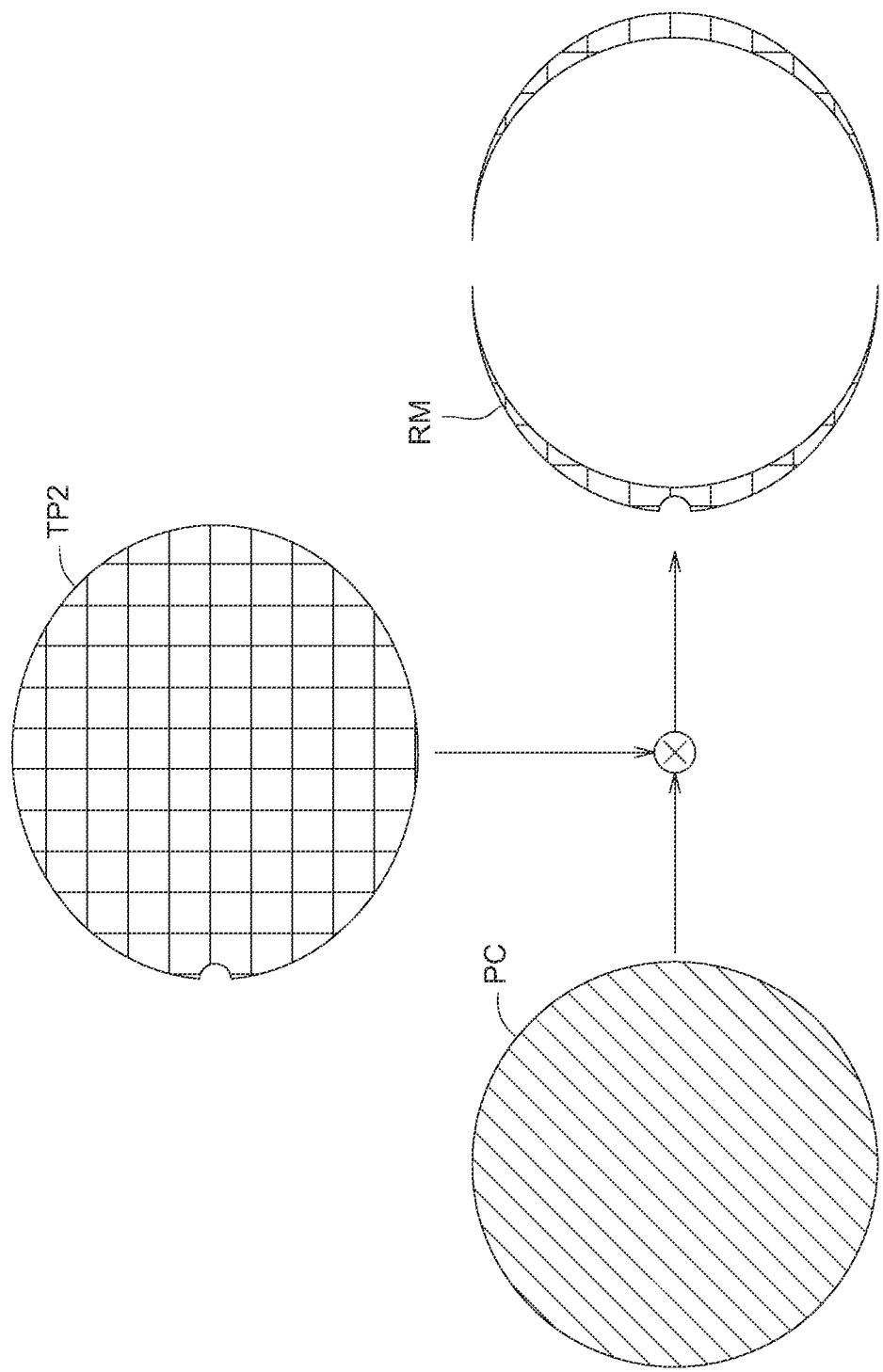
FIG. 13 is a schematic diagram of the step S210.

Referring to FIG. 13, a schematic diagram of step S210 is illustrated. The eccentricity judgment unit 210 compares the templet image TP2 with a perfect circle PC. If the difference between the templet image TP2 and the perfect circle PC produces a residual image RM, this indicates that some of the wafer images WF11', WF12', . . . , WF1*n*' are eccentric, If the difference between the templet image TP2 and the perfect circle PC does not produce a residual image RM, this indicates that none of the wafer images WF11', WF12', . . . , WF1*n*' is eccentric.

In step S220, each eccentric wafer image is removed by the integration unit 130, and a new templet image TP3 is created. Through the above method, the accuracy of the templet image TP3 can be further increased to improve the automatic detection of edge crack.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An automatic detection method for detecting any crack on a plurality of wafer edges, comprising:
   obtaining a plurality of wafer images to be detected of a plurality of wafers;
   integrating the plurality of wafer images to be detected to create a templet image;
   comparing each of the plurality of wafer images to be detected with the templet image to obtain a plurality of differential images;
   clipping each of the plurality of differential images along the plurality of wafer edges, such that each of the plurality of differential images becomes annular shaped;
   binarizing each of the plurality of differential images which are clipped to be annular shaped;
   de-noising each of the plurality of differential images which are binarized; and
   detecting whether each of the plurality of differential images which are de-noised has an edge crack according to a pattern of each of the plurality of differential images which are de-noised.

2. The automatic detection method according to claim 1, further comprising:
   converting the plurality of wafer images to be detected into gray contents.

3. The automatic detection method according to claim 1, further comprising:
   performing coordinate conversion on each of the plurality of differential images which are clipped to be annular shaped, such that each of the plurality of differential images which are clipped to be annular shaped becomes rectangular shaped.

4. The automatic detection method according to claim 3, wherein a width of each of the plurality of differential images which are clipped to be annular shaped is substantially 1.5% of radius of each of the plurality of wafers.

5. The automatic detection method according to claim 3, wherein each of the plurality of differential images which are clipped to be annular shaped is converted to a Cartesian coordinate system from a polar coordinate system.

6. The automatic detection method according to claim 1, wherein the step of de-noising each of the plurality of differential images which are binarized comprises:
   expanding a pattern of each of the plurality of differential images which are binarized; and
   eroding the pattern of each of the plurality of differential images whose patterns are expanded.

7. The automatic detection method according to claim 1, wherein each of the plurality of wafer images to be detected has a plurality of pixels, and in the step of integrating the plurality of wafer images to be detected to create the templet image, for each of the plurality of pixels, a maximum pixel value among the plurality of wafer images to be detected is obtained to create the templet image.

8. The automatic detection method according to claim 1, wherein in the step of comparing each of the plurality of wafer images to be detected with the templet image to obtain each of the plurality of differential images, each of the plurality of differential images is obtained by deducting each of the plurality of wafer images to be detected from the templet image.

9. The automatic detection method according to claim 1, further comprising:
comparing the templet image with a perfect circle to determine whether any of the plurality of wafer images to be detected is eccentric.

10. The automatic detection method according to claim 1, wherein the automatic detection method is performed before a manufacturing process of the plurality of wafers is completed.

11. An automatic detection device for detecting any crack on a plurality of wafer edges, comprising:
an input unit configured to obtain a plurality of wafer images to be detected of a plurality of wafers;
an integration unit configured to integrate the plurality of wafer images to be detected to create a templet image;
a comparison unit configured to compare each of the plurality of wafer images to be detected with the templet image to obtain a plurality of differential images;
a clipping unit configured to clip each of the plurality of differential images along the plurality of wafer edges, such that each of the plurality of differential images becomes annular shaped;
a binarization unit configured to binarize each of the plurality of differential images which are clipped to be annular shaped;
a de-noising unit configured to de-noise each of the plurality of differential images which are binarized; and
a detection unit configured to detect whether each of the plurality of differential images which are de-noised has an edge crack according to a pattern of each of the plurality of differential images which are de-noised.

12. The automatic detection device according to claim 11, further comprising:
a grayscale unit configured to convert the plurality of wafer images to be detected into gray contents.

13. The automatic detection device according to claim 11, further comprising:
a conversion unit configured to perform coordinate conversion on each of the plurality of differential images which are clipped to be annular shaped, such that each of the plurality of differential images which are clipped to be annular shaped becomes rectangular shaped.

14. The automatic detection device according to claim 13, wherein a width of each of the plurality of differential images which are clipped to be annular shaped is substantially 1.5% of radius of each of the plurality of wafers.

15. The automatic detection device according to claim 13, wherein each of the plurality of differential images which are clipped to be annular shaped is converted to a Cartesian coordinate system from a polar coordinate system.

16. The automatic detection device according to claim 11, wherein the de-noising unit comprises:
an expander configured to expand a pattern of each of the plurality of differential images which are binarized; and
an eroder configured to erode the pattern of each of the plurality of differential images which are expanded.

17. The automatic detection device according to claim 11, wherein each of the plurality of wafer images to be detected has a plurality of pixels, and for each of the plurality of pixels, the integration unit obtains a maximum pixel value among the plurality of wafer images to be detected to create the templet image.

18. The automatic detection device according to claim 11, wherein the comparison unit obtains each of the plurality of differential images by deducting each of the plurality of wafer images to be detected from the templet image.

19. The automatic detection device according to claim 11, further comprising:
an eccentricity judgment unit configured to compare the templet image with a perfect circle to determine whether any of the plurality of wafer images to be detected is eccentric.

* * * * *